(12) United States Patent
Peng et al.

(10) Patent No.: US 12,640,715 B2
(45) Date of Patent: May 26, 2026

(54) DEMODULATION CIRCUIT AND DIGITAL ISOLATOR

(71) Applicant: ALPHA AND OMEGA SEMICONDUCTOR INTERNATIONAL LP, Ontario (CA)

(72) Inventors: Hao Peng, San Jose, CA (US); Ziwei Yu, Cupertino, CA (US); Sitthipong Angkititrakul, Dublin, CA (US)

(73) Assignee: ALPHA AND OMEGA SEMICONDUCTOR INTERNATIONAL LP, Ontario (CA)

( * ) Notice: Subject to any disclaimer, the term of this patent is extended or adjusted under 35 U.S.C. 154(b) by 92 days.

(21) Appl. No.: 18/735,140

(22) Filed: Jun. 5, 2024

(65) Prior Publication Data

US 2025/0379564 A1 Dec. 11, 2025

(51) Int. Cl.
*H03K 5/125* (2006.01)
*H03K 3/037* (2006.01)
*H03K 5/00* (2006.01)
*H03K 19/20* (2006.01)

(52) U.S. Cl.
CPC ............. *H03K 5/125* (2013.01); *H03K 3/037* (2013.01); *H03K 2005/00078* (2013.01); *H03K 19/20* (2013.01)

(58) Field of Classification Search
CPC ........ H03K 5/125; H03K 3/037; H03K 19/20; H03K 2005/00078; H03K 5/1252
USPC .......................................................... 327/155
See application file for complete search history.

(56) References Cited

U.S. PATENT DOCUMENTS

| | | | |
|---|---|---|---|
| 10,601,614 B1 * | 3/2020 | Liu ...................... | H04L 27/2275 |
| 2012/0161840 A1 * | 6/2012 | Kojima ................ | H03K 3/0375 |
| | | | 327/217 |
| 2018/0323746 A1 * | 11/2018 | Kamath .................. | H03D 3/00 |
| 2021/0096592 A1 * | 4/2021 | Hanschke ............. | H04L 7/0037 |
| 2025/0379564 A1 * | 12/2025 | Peng ...................... | H03K 5/125 |

FOREIGN PATENT DOCUMENTS

CN 116743118 A 8/2023

OTHER PUBLICATIONS

English abstract of CN116743118A.

* cited by examiner

*Primary Examiner* — Ryan Jager
(74) *Attorney, Agent, or Firm* — WPAT, P.C.; Anthony King

(57) ABSTRACT

The demodulation circuit includes a waveform regulator, a first counter, a second counter, and an SR latch. The waveform regulator generates a regulated modulation signal according to a pair of differential isolated modulation signals, which is generated according to a modulation of an input data signal with a carrier clock signal. The first counter counts cycles of the regulated modulation signal so as to generate a set signal. The second counter counts cycles of a reference clock signal so as to generate a reset signal. The SR latch includes a set terminal for receiving the set signal, a reset terminal for receiving the reset signal, and an output terminal for outputting a demodulated output signal. The SR latch is triggered by the set signal to pull up the demodulated output signal, and is triggered by the reset signal to pull down the demodulated output signal.

20 Claims, 8 Drawing Sheets

DEMODULATION CIRCUIT AND DIGITAL ISOLATOR

TECHNICAL FIELD

The present disclosure relates to a demodulation circuit, and more particularly, to a demodulation circuit employed in a digital isolator.

DISCUSSION OF THE BACKGROUND

A digital isolator is a device that provides electrical isolation between two digital systems while allowing data to be transferred between them. This isolation is important for safety and noise reduction in many electronic systems, particularly in industrial and automotive applications. The digital isolator allows one circuit to transmit digital signals across an isolation barrier to another without the need for physical contact or a direct electrical connection. The isolation barrier is usually implemented by using techniques such as capacitive coupling, magnetic coupling, or optical isolation.

One key challenge for the digital isolators is to meet the requirement of common mode transient immunity (CMTI). The common mode transients are sudden voltage spikes or fluctuations that occur between grounds of the two circuits on the two sides of the isolation barrier. These transients can cause errors to the digital isolator if not properly addressed.

SUMMARY

One aspect of the present disclosure provides a demodulation circuit. The demodulation circuit includes a waveform regulator, a first counter, a second counter, and a set-reset (SR) latch. The waveform regulator is configured to generate a regulated modulation signal according to a pair of differential isolated modulation signals. The pair of differential isolated modulation signals is generated according to a modulation of an input data signal with a carrier clock signal. The first counter includes a clock input terminal configured to receive the regulated modulation signal, a reset terminal, and an output terminal configured to output a set signal. The second counter includes a clock input terminal configured to receive a reference clock signal, a reset terminal configured to receive the regulated modulation signal, and a first output terminal configured to output a reset signal. The SR latch includes a set terminal coupled to the output terminal of the first counter, a reset terminal coupled to the output terminal of the second counter, and an output terminal configured to output a demodulated output signal. The first counter is configured to count cycles of the regulated modulation signal so as to generate the set signal and trigger the first SR latch to pull up the demodulated output signal, and the second counter is configured to count cycles of the reference clock signal so as to generate the reset signal and trigger the first SR latch to pull down the demodulated output signal.

Another aspect of the present disclosure provides a digital isolator. The digital isolator includes an isolation circuit and a demodulation circuit aforementioned. The isolation circuit receives a pair of differential modulated input signals generated by modulating an input data signal with a carrier clock signal and output the pair of differential isolated modulation signals.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
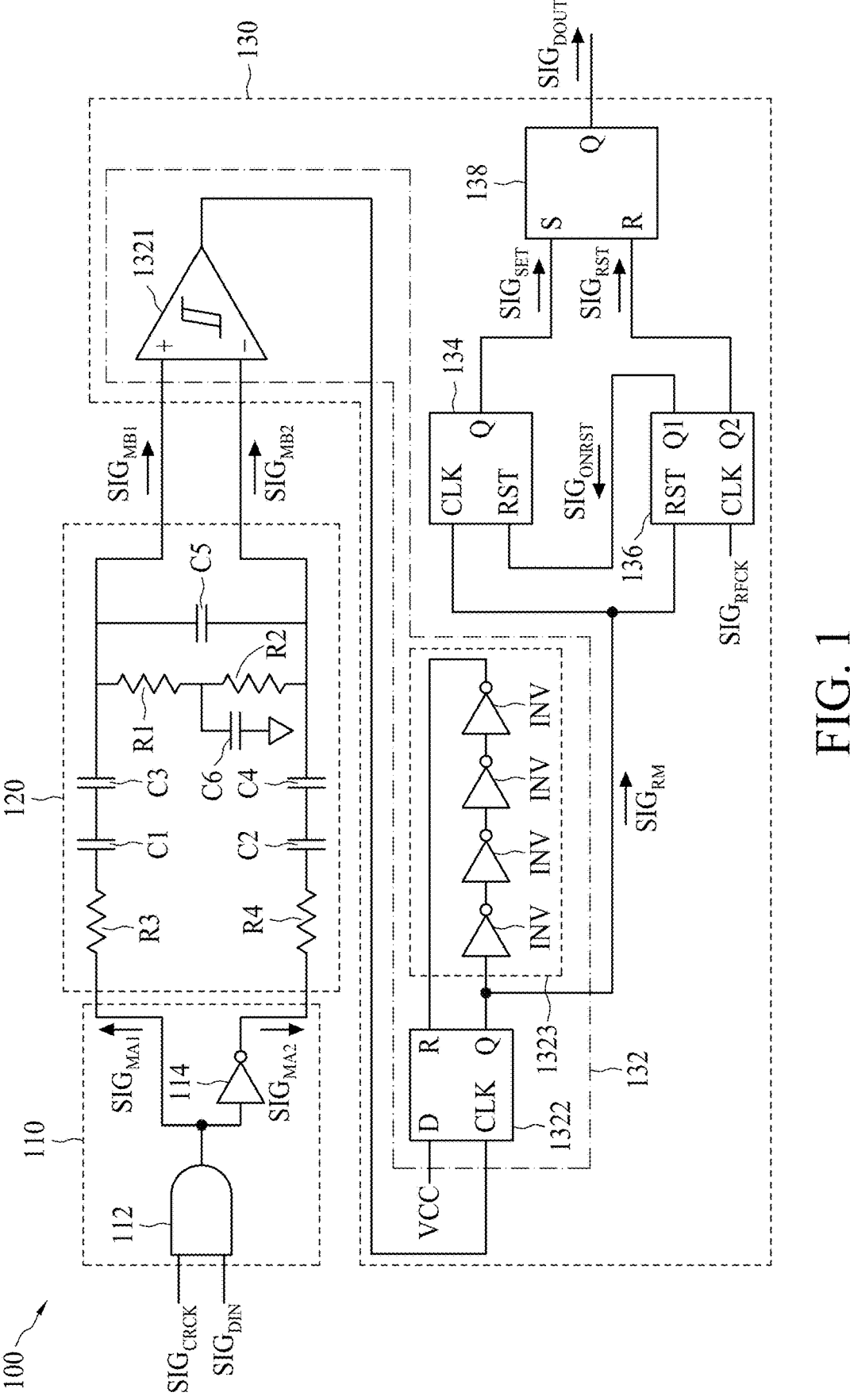
FIG. 1 shows a digital isolator according to a first embodiment of the present disclosure.

FIG. 1 shows a digital isolator 100 according to a first embodiment of the present disclosure. The digital isolator 100 includes a modulation circuit 110, an isolation circuit 120, and a demodulation circuit 130. The digital isolator 100 provides isolation between its input side (e.g., where the modulation circuit 110 locates) and its output side (e.g., where the demodulation circuit 130 locates) with capacitive isolation barriers formed in the isolation circuit 120. In some embodiments, the capacitive based isolation circuit 120 can be seen as a high pass filter or a band pass filter that can block the low frequency noises. In such case, to allow data transferring between two sides of the capacitive isolation barriers, the modulation circuit 110 modulates the input data signal $\text{SIG}_{DIN}$ with a carrier clock signal $\text{SIG}_{CRCK}$ having a carrier frequency to convert the input data signal $\text{SIG}_{DIN}$ having a low frequency to a modulated input signal $SIG_{MA1}$ and a modulated input signal $SIG_{MA2}$ complementary to the modulated input signal $SIG_{MA1}$. Since the modulated input signals $SIG_{MA1}$ and $SIG_{MA2}$ both have a high frequency, they are allowed to cross the filter of the isolation circuit 120.

Figure 2:
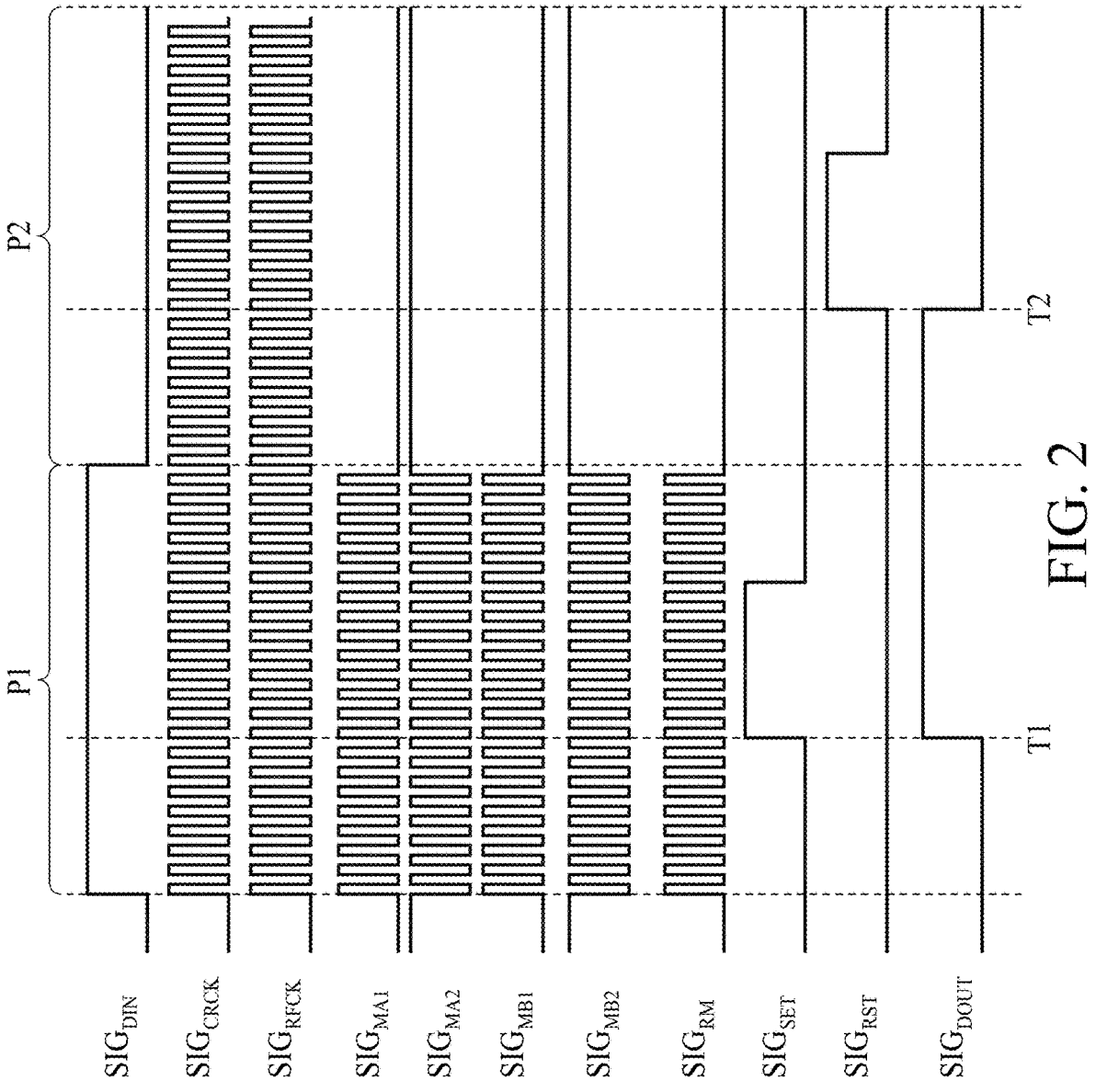
FIG. 2 shows a signal timing diagram of the digital isolator in FIG. 1.

FIG. 2 shows a signal timing diagram of the digital isolator 100. As shown in FIG. 2, during the period P1, the input data signal $SIG_{DIN}$ is at a logic high voltage, and the modulation circuit 110 can modulate the input data signal $SIG_{DIN}$ to generate the modulated input signals $SIG_{MA1}$ and $SIG_{MA2}$ that have a high frequency as the frequency of the carrier clock signal $SIG_{CRCK}$. Also, during the period P2, the input data signal $SIG_{DIN}$ is at a logic low voltage, and the modulation circuit 110 would keep the modulated input signal $SIG_{MA1}$ at the logic low voltage and keep the modulated input signal $SIG_{MA2}$ at the logic high voltage.

The isolation circuit 120 receives the modulated input signals $SIG_{MA1}$ and $SIG_{MA2}$ and outputs the isolated modulation signals $SIG_{MB1}$ and $SIG_{MB2}$ after filtering. Subsequently, the demodulation circuit 130 demodulates the isolated modulation signals $SIG_{MB1}$ and $SIG_{MB2}$ to obtain the demodulated output signal $SIG_{DOUT}$ that resembles the input data signal $SIG_{DIN}$ as shown in FIG. 2. As a result, the data transmission crossing two sides of the isolation barrier is achieved. In the present embodiment, the demodulation circuit 130 adopts two counters 134 and 136 for turning on and turning off an SR latch 138 so as to generate the demodulated output signal $SIG_{DOUT}$. In such case, by taking the advantage of the time-measuring ability of the counters 134 and 136, the demodulation circuit 130 is able to ignore the noises caused by common mode transient, thereby reducing glitches in the demodulated output signal $SIG_{DOUT}$ and allowing the digital isolator 100 to achieve high CMTI.

Below, more details and structures about the modulation circuit 110, the isolation circuit 120, and the demodulation circuit 130 are introduced.

As shown in FIG. 1, the modulation circuit 110 includes an AND gate 112 and an inverter 114. The AND gate 112 includes a first input terminal for receiving the carrier clock signal $SIG_{CRCK}$, a second input terminal for receiving the input data signal $SIG_{DIN}$, and an output terminal for outputting the modulated input signal $SIG_{MA1}$. The inverter 114 includes an input terminal coupled to the output terminal of the AND gate 112, and an output terminal for outputting the modulated input signal $SIG_{MA2}$. In such case, the modulated input signal $SIG_{MA2}$ outputted by the inverter 114 is complementary to the modulated input signal $SIG_{MA1}$ outputted by the AND gate 112, and the modulated input signals $SIG_{MA1}$ and $SIG_{MA2}$ can be seen as a pair of differential modulated input signals.

In the present embodiment, the modulation is performed by the AND gate 112. However, in alternate embodiments, the modulation can be performed by logic gates other than the AND gate 112. For example, an NAND gate, instead of the AND gate 112, may be adopted for the data modulation. Furthermore, in some embodiments, to compensate the delay caused by the inverter 114 so as to synchronize the modulated input signal $SIG_{MA1}$ and the modulated input signal $SIG_{MA2}$, more inverters and/or non-inverting pass gate may be adopted on the input paths and the output path of the modulation circuit 110.

The isolation circuit 120 receives the pair of differential modulated input signals $SIG_{MA1}$ and $SIG_{MA2}$ and output a pair of differential isolated modulation signals $SIG_{MB1}$ and $SIG_{MB2}$. As shown in FIG. 1, the isolation circuit 120 includes resistors R1 and R2, and capacitors C1, C2, C3, and C4.

The capacitor C1 includes a first terminal for receiving the modulated input signal $SIG_{MA1}$, and a second terminal. The capacitor C2 includes a first terminal for receiving the modulated input signal $SIG_{MA2}$, and a second terminal. The capacitor C3 includes a first terminal coupled to the second terminal of the capacitor C1, and a second terminal for outputting the isolated modulation signal $SIG_{MB1}$. The capacitor C4 includes a first terminal coupled to the second terminal of the capacitor C2, and a second terminal for outputting the isolated modulation signal $SIG_{MB2}$. The resistor R1 includes a first terminal coupled to the second terminal of the capacitor C3, and a second terminal. The resistor R2 includes a first terminal coupled to the second terminal of the capacitor C4, and a second terminal coupled to the second terminal of the third resistor R2.

In the isolation circuit 120, the capacitor-resistor networks formed by the capacitors C1, C3, C2, C4, and the resistors R1, R2 can block the low frequency noise and differentiate the modulated input signals $SIG_{MA1}$ and $SIG_{MA2}$ into signal transients (i.e., the isolated modulation signals $SIG_{MB1}$ and $SIG_{MB2}$). In some embodiments, the capacitors C1, C2, C3, and C4 may have same capacitance, for example, but not limited to, about 70 fF, and the resistors R3 and R4 may have the same resistance, for example, but not limited to, smaller than or equal to 150 ohms ($\Omega$).

Furthermore, in some embodiments, the modulation circuit 110 and the capacitors C1 and C2 are disposed in one chip while the demodulation circuit 130 and the capacitors C3 and C4 are disposed in another chip, thereby ensuring the isolation between the input stage and the output stage of the digital isolator 100. In such case, the second terminals of the capacitors C1 and C2 are coupled to the first terminals of the capacitors C3 and C4 correspondingly through bonding wires.

As shown in FIG. 1, the isolation circuit 120 further includes a resistor R3 coupled between the capacitor C1 and the modulation circuit 110 and a resistor R4 coupled between the capacitor C2 and the modulation circuit 110. The resistor R3 includes a first terminal coupled to the output of the AND gate 112 for receiving the modulated input signal $SIG_{MA1}$, and a second terminal coupled to the first terminal of the capacitor C1. The resistor R4 includes a first terminal coupled to the output of the inverter 114 for receiving the modulated input signal $SIG_{MA2}$, and a second terminal coupled to the first terminal of the capacitor C2.

The resistors R3 and R4 are inserted to increase the time constant of the isolation circuit 120 so that the glitch seen at the input of the hysteric comparator 1321 in the demodulation circuit 130 may drop slower, thereby allowing the comparator 1321 to react accordingly. In some embodiments, the resistors R3 and R4 may have the same resistance, for example, but not limited to, 500 ohms ($\Omega$).

In addition, as shown in FIG. 1, the isolation circuit 120 further includes a capacitor C5 and a capacitor C6. The capacitor C5 is the input capacitor of the comparator 1321, and the capacitor C6 is adopted to retain and indicate the common mode voltage of the pair of differential isolated modulation signals $SIG_{MB1}$ and $SIG_{MB2}$. In some embodiments, the capacitor C5 can be crucial for the comparator 1321 to receive input signals within a proper amplitude range. In some embodiments, the capacitance of the capacitor C5 should be less than the capacitance of the capacitors C1, C2, C3, or C4.

The demodulation circuit 130 includes a waveform regulator 132, a first counter 134, a second counter 136, and a set-reset (SR) latch 138. The waveform regulator 132 generates a regulated modulation signal $SIG_{RM}$ according to the pair of differential isolated modulation signals $SIG_{MB1}$ and $SIG_{MB2}$. The first counter 134 can generate a set signal $SIG_{SET}$ and trigger the SR latch 138 to pull up the demodulated output signal $SIG_{DOUT}$ when the input data signal $SIG_{DIN}$ is at the logic high voltage and is modulated by the carrier clock signal $SIG_{CRCK}$. Also, the second counter 136 can generate a reset signal $SIG_{RST}$ and trigger the SR latch 138 to pull down the demodulated output signal $SIG_{DOUT}$ when the input data signal $SIG_{DIN}$ is at the logic low voltage.

The waveform regulator 132 includes a hysteric comparator 1321, a D flip-flop 1322, and a delay circuit 1323. The hysteric comparator 1321 includes a non-inverting input terminal for receiving the isolated modulation signal $SIG_{MB1}$, an inverting input terminal for receiving the isolated modulation signal $SIG_{MB2}$, and an output terminal. The D flip-flop 1322 includes a data terminal for receiving a supply voltage VCC, a clock terminal coupled to the output terminal of the hysteric comparator 1321, a reset terminal, and an output terminal for outputting the regulated modulation signal $SIG_{RM}$. The delay circuit 1323 includes an input terminal coupled to the output terminal of the D flip-flop 1322, and an output terminal coupled to the reset terminal of the D flip-flop 1322.

When the non-inverting input terminal of the hysteric comparator 1321 is on a higher potential than its inverting input terminal by a threshold, the output terminal of the hysteric comparator 1321 presents a high voltage. Also, when the inverting input terminal of the hysteric comparator 1321 is on a higher potential than its non-inverting input terminal by a threshold, the output terminal of the hysteric comparator 1321 presents a low voltage. As a result, the hysteric comparator 1321 converts the signal transients (i.e., the isolated modulation signals $SIG_{MB1}$ and $SIG_{MB2}$) into pulses for triggering the D flip-flop 1322.

Each time when the D flip-flop is triggered to output a logic high voltage, the delay circuit 1323 would sequentially reset the D flip-flop 1322 after a predetermined delay time. With the fixed delay provided by the delay circuit 1323, the waveform regulator 132 can generate the regulated modulation signal $SIG_{RM}$ with uniform duty cycles as the isolated modulation signals $SIG_{MB1}$ and $SIG_{MB2}$ are toggling periodically during the signal modulation. In some embodiments, the waveform regulator 132 may regulate the regulated modulation signal $SIG_{RM}$ to have duty cycles equal to about 50%; however, the present disclosure is not limited thereto.

The regulated modulation signal $SIG_{RM}$ is then received by the first counter 134 as a clock signal and received by the second counter 136 as a reset signal. Specifically, the first counter 134 includes a clock input terminal for receiving the regulated modulation signal $SIG_{RM}$, a reset terminal, and an output terminal for outputting a set signal $SIG_{SET}$. The second counter 136 includes a clock input terminal for receiving a reference clock signal $SIG_{RFCK}$, a reset terminal for receiving the regulated modulation signal $SIG_{RM}$, a first output terminal for outputting a reset signal $SIG_{RST}$, and a second output terminal coupled to the reset terminal of the first counter 134 for outputting a turn-on reset signal $SIG_{ONRST}$. The SR latch 138 includes a set terminal coupled to the output terminal of the first counter 134, a reset terminal coupled to the output terminal of the second counter 136, and an output terminal for outputting the demodulated output signal $SIG_{DOUT}$.

When the regulated modulation signal $SIG_{RM}$ continues to toggle, it may imply that the input data signal $SIG_{DIN}$ is at the logic high voltage and is modulated by the carrier clock signal $SIG_{CRCK}$. In such case, the first counter 134 can keep counting the cycles of the regulated modulation signal $SIG_{RM}$ to determine if the repeated voltage transitions of the regulated modulation signal $SIG_{RM}$ is caused by signal modulation or caused by transient noises. The first counter 134 can generate the set signal $SIG_{SET}$ according to the cycle counting result and trigger the SR latch 138 to pull up the demodulated output signal $SIG_{DOUT}$ when a predetermined number of cycles are counted.

For example, in period P1 of FIG. 2, the regulated modulation signal $SIG_{RM}$ keeps toggling as the input data signal $SIG_{DIN}$ is modulated with the carrier clock signal $SIG_{CRCK}$. In such case, the first counter 134 may generate the set signal $SIG_{SET}$ having a logic high voltage when eight cycles of the regulated modulation signal $SIG_{RM}$ has been counted, and the SR latch 138 will pull up the demodulated output signal $SIG_{DOUT}$ to the logic high voltage at the time T1 accordingly. In other words, by counting the number of cycles of the regulated modulation signal $SIG_{RM}$, the first counter 134 can wait for a period of time before sending the set signal $SIG_{SET}$ when detecting the toggling of the regulated modulation signal $SIG_{RM}$, thereby ensuring that the voltage transitions of the regulated modulation signal $SIG_{RM}$ are caused by stable data modulation, and reducing glitches caused by unstable transients. Therefore, in the present disclosure, the number of cycles of the regulated modulation signal $SIG_{RM}$ that the first counter 134 needs to count before generating the set signal $SIG_{SET}$ can also be referred to a turn-on deglitch threshold number.

In some embodiments, the carrier clock $SIG_{CRCK}$ has a frequency of, for example, but not limited to, 500 MHz, and by counting eight cycles of the regulated modulation signal $SIG_{RM}$, the first counter 134 would cause an input-output delay of 16 ns, which is rather short and acceptable for most cases. However, in some embodiments, the turn-on deglitch threshold number can be programmable for the first counter 134 and can be adjusted according to the needs.

Furthermore, when the regulated modulation signal $SIG_{RM}$ remains at the logic low voltage (e.g., in period P2 of FIG. 2), it may imply that the input data signal $SIG_{DIN}$ is also at the logic low voltage. In such case, the second counter 136 can count the cycles of the reference clock signal $SIG_{RFCK}$ to measure the duration the regulated modulation signal $SIG_{RM}$ remains at the logic low voltage so as to determine if the regulated modulation signal $SIG_{RM}$ at the logic low voltage represents the status of the input data signal $SIG_{DIN}$ or is caused by transient noises. Therefore, the second counter 136 can generate the reset signal $SIG_{RST}$ according to the cycle counting result and trigger the SR latch 138 to pull down the demodulated output signal $SIG_{DOUT}$ when a predetermined number of cycles are counted.

For example, in period P2 of FIG. 2, the regulated modulation signal $SIG_{RM}$ remains at the logic low voltage, and the second counter 136 can generate the reset signal $SIG_{RST}$ having the logic high voltage after eight cycles of the reference clock signal $SIG_{RFCK}$ has been counted. As a result, the SR latch 138 would be reset by the reset signal $SIG_{RST}$ and pull down the demodulated output signal $SIG_{DOUT}$ at the time T2. As a result, the demodulated output signal $SIG_{DOUT}$ can reproduce the waveform of the input data signal $SIG_{DIN}$ after a small input-output delay caused by the counting of the second counter 136. In some embodiments, the turn-off deglitch threshold number (i.e., the number of cycles of the reference clock signal $SIG_{RFCK}$ that the second counter 136 needs to count before generating the reset signal $SIG_{RST}$) can be programmable, and can be adjusted according to the needs.

In some embodiments, a frequency of the reference clock signal $SIG_{RFCK}$ can be equal to the frequency of the carrier clock signal $SIG_{CRCK}$, and the reference clock signal $SIG_{RFCK}$ can be generated by an oscillator different from the one that generates the carrier clock signal $SIG_{CRCK}$ since the modulation circuit 110 and the demodulation circuit 120 are disposed in different chips. In some embodiments, the reference clock signal $SIG_{RFCK}$ can be generated by an external oscillator, however, the present disclosure is not limited thereto. In addition, in FIG. 2 (and the following FIGS. 3 and 4), the reference clock signal $SIG_{RFCK}$ is in the same phase as the carrier clock signal $SIG_{CRCK}$. However, the present disclosure is not limited thereto. In some embodiments, the reference clock signal $SIG_{RFCK}$ and the carrier clock signal $SIG_{CRCK}$ may be out of phase, and a mild edge transition inaccuracy may be caused, which will not affect the deglitch function and the demodulation function of the demodulation circuit 130.

In the present embodiment, the first counter 134 may include a counter register having a size of 4 bits for recording the current counting value. In such case, as the first counter 134 keeps counting the cycles of the regulated modulation signal $SIG_{RM}$, the counter register may over flow and the counting value may return to zero. When the counting value returns to zero, the first counter 134 may stop sending the set signal $SIG_{SET}$ having the logic high voltage as shown in FIG. 2. Since the SR latch 138 can be implemented by NOR gates, the demodulated output signal $SIG_{DOUT}$ outputted by the SR latch 138 will remain at the logic high voltage as long as no reset signal $SIG_{RST}$ is received. Similarly, the second counter 136 may also include a counter register having a size of 4 bits for recording the current counting value, and the current counting value may return to zero when the counter register is overflow. Therefore, the second counter 136 may not continuously output-ting the reset signal $SIG_{RST}$ at the logic high voltage as shown in the period P2 of FIG. 2. However, as aforementioned, the SR latch 138 will remain at the logic low voltage before a next set signal $SIG_{SET}$ is received.

Since the first counter 134 can generate the set signal $SIG_{SET}$ to trigger the SR latch 138 and pull up the demodulated output signal $SIG_{DOUT}$ after counting a predetermined number of cycles of the regulated modulation signal $SIG_{RM}$, and the second counter 136 can generate the reset signal $SIG_{RST}$ to trigger the SR latch 138 and pull down the demodulated output signal $SIG_{DOUT}$ after counting a prede-termined number of the reference clock signal $SIG_{RFCK}$, glitches of the demodulated output signal $SIG_{DOUT}$ caused by common mode transients can be reduced.

Figure 3:
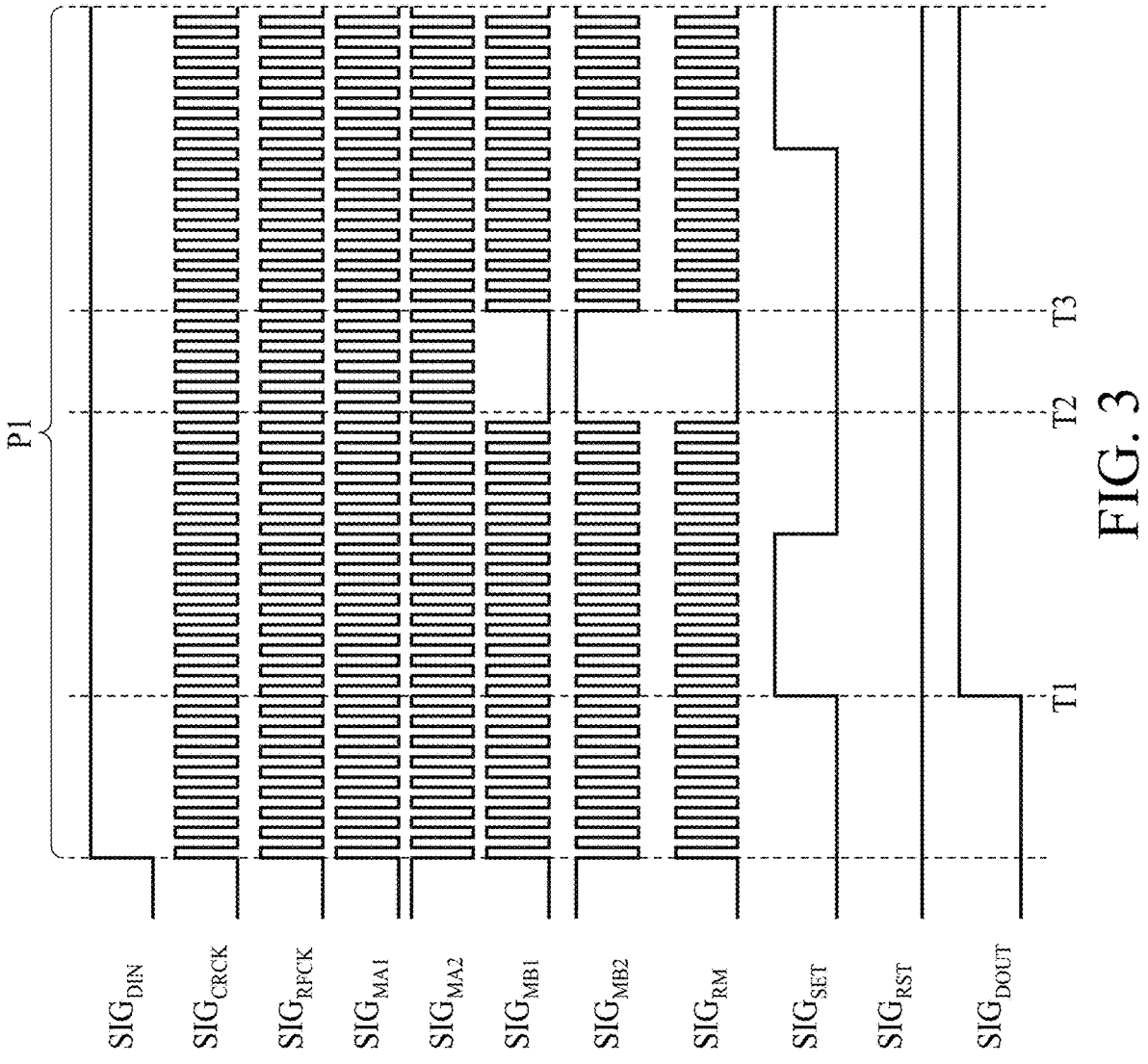
FIG. 3 shows a signal timing diagram of the digital isolator in FIG. 1 to demonstrate the deglitch capability in one exemplary situation.

FIG. 3 shows a signal timing diagram of the digital isolator 100 to demonstrate the deglitch capability in an exemplary situation. As shown in FIG. 3, in the beginning period P1, the input data signal $SIG_{DIN}$ is at the logic high voltage and the regulated modulation signal $SIG_{RM}$ keeps toggling. Subsequently, after eight cycles of the regulated modulation signal $SIG_{RM}$, the first counter 134 generates the set signal $SIG_{SET}$ having the logic high voltage to trigger the SR latch 138 and pull up the demodulated output signal $SIG_{DOUT}$ at time T1.

At the time T2 in FIG. 3, the common mode transient occurs, which cause five pulses of the regulated modulation signal $SIG_{RM}$ missing. In such case, when the regulated modulation signal $SIG_{RM}$ changes to the logic low voltage, the second counter 136 will start to count the cycles of the reference clock signal $SIG_{RFCK}$. However, after the second counter 136 counts to the fifth cycles of the reference clock signal $SIG_{RFCK}$, the second counter 136 will be reset because the regulated modulation signal $SIG_{RM}$ is changed back to the logic high voltage again at time T3. Since the second counter 136 does not reach the turn-off deglitch number (e.g. eight), the second counter 136 would not generate the reset signal $SIG_{RST}$ having the logic high voltage, and thus, the demodulated output signal $SIG_{DOUT}$ will remain at the logic high voltage throughout the whole duration shown in FIG. 3 without being affected by the common mode transient. In other words, the counting scheme of the second counter 136 is able to avoid the glitch caused by the common mode transient, thereby improving the CMTI of the digital isolator 100. The same deglitch ability can be achieved by the counting scheme of the first counter 134.

In addition, the common mode transients may not only cause missing pulses but also cause unexpected pulses. Therefore, the second counter 136 may further generate the turn-on reset signal $SIG_{ONRST}$ to reset the first counter 134 when the unexpected pulses caused by common mode transients are produced. Specifically, since the unexpected pulses may have a lower frequency and may stay at the logic low voltage for a longer period, the second counter 136 can measure a length of an off-time of the regulated modulation signal $SIG_{RM}$ (i.e., the time the regulated modulation signal $SIG_{RM}$ is at the logic low voltage), and output the turn-on reset signal $SIG_{ONRST}$ through the second output terminal to reset the first counter 134 when a duration of the regulated modulation signal $SIG_{RM}$ remaining at the logic low voltage is longer than a maximum allowable off-time (e.g., a dura-tion of a predetermined number of cycles of the reference clock signal $SIG_{RFCK}$).

Figure 4:
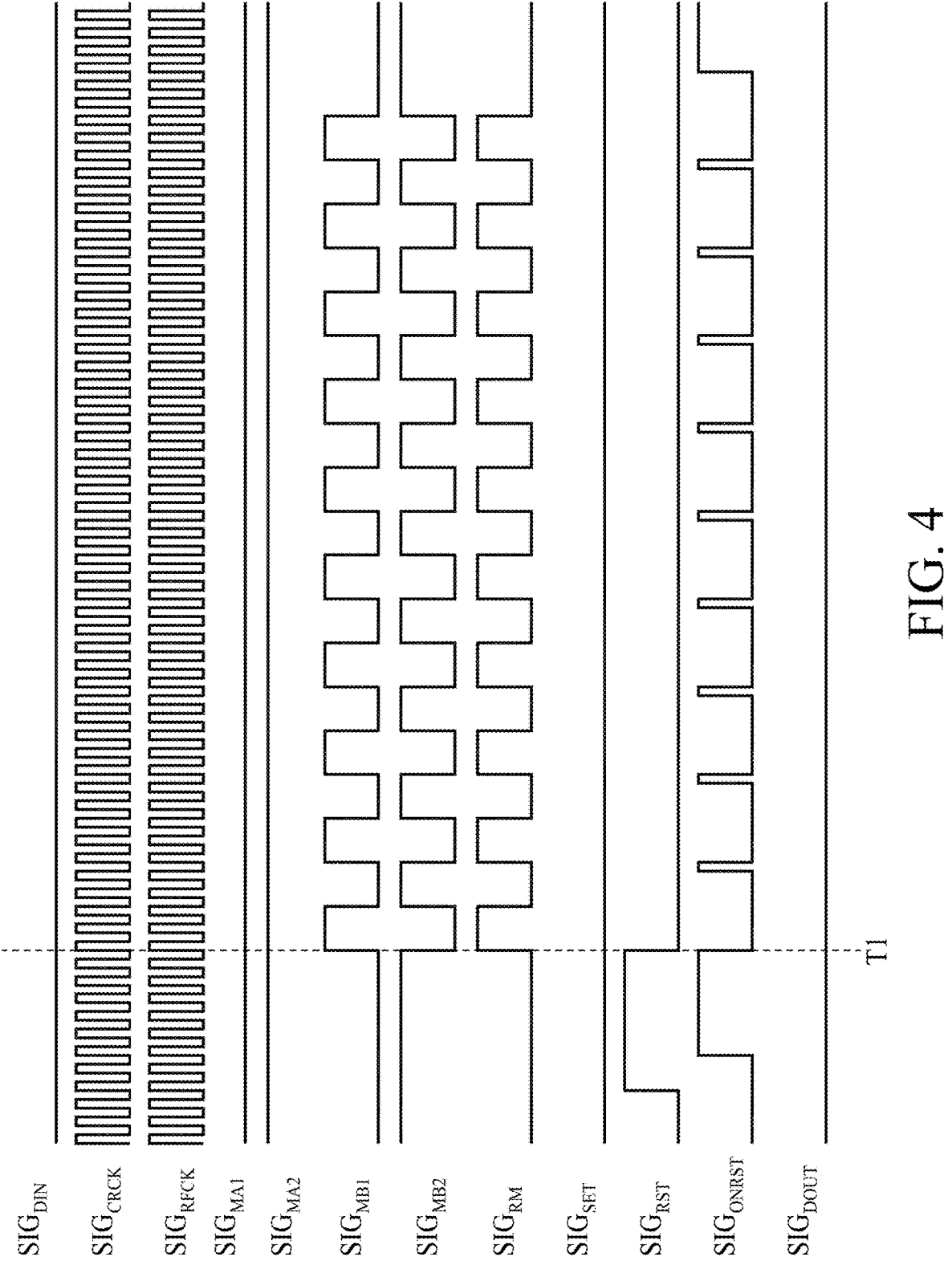
FIG. 4 shows a signal timing diagram of the digital isolator in FIG. 1 to demonstrate the deglitch capability in another exemplary situation.

FIG. 4 shows a signal timing diagram of the digital isolator 100 to demonstrate the deglitch capability in another exemplary situation. As shown in FIG. 4, the modulated input signal $SIG_{MA1}$ remain at the logic low voltage and the modulated input signal $SIG_{MA1}$ remain at the logic high voltage as the input data signal $SIG_{DIN}$ remains at the logic low voltage, however, at the time T1, a common mode transient occurs, which causes ten unexpected pulses to the regulated modulation signal $SIG_{RM}$. In such case, the num-ber of unexpected pulses are greater than the turn-on deglitch threshold number (e.g., eight cycles of the regulated modulation signal $SIG_{RM}$) predetermined for the first coun-ter 134. However, since each of the 10 pulses has an off-time longer than the maximum allowable off-time (e.g., two cycles of the reference clock signal $SIG_{RFCK}$) predetermined for the second counter 136, the second counter 136 would reset the first counter 134 in each of the ten pulses.

As a result, the counted value of the first counter 134 will remain at one for the ten pulses and will not reach the turn-on deglitch threshold number (e.g., eight). Therefore, the first counter 134 will not generate the set signal $SIG_{SET}$ during the full period shown in the timing diagram of FIG. 4. In such case, the demodulated output signal $SIG_{DOUT}$ would remain at the logic low voltage as the input data signal $SIG_{DIN}$ even when the common mode transient occurs. In some embodiments, the number of cycles of the reference clock signal $SIG_{RFCK}$ that the second counter 136 needs to count to determine the maximum allowable off-time can be programmable and can be adjusted according to the needs.

In other word, for the first counter 134 to generate the set signal $SIG_{SET}$ and trigger the SR latch 138 to pull up the demodulated output signal $SIG_{DOUT}$, the first counter 134 must count at least eight cycles of the regulated modulation signal $SIG_{RM}$ while the off-time in each of these eight cycles of the regulated modulation signal $SIG_{RM}$ should not be more than two cycles of the reference clock signal $SIG_{RFCK}$. For example, although the turn-on reset signal $SIG_{ONRST}$ are not shown in FIGS. 2 and 3, however, during the period P1 in FIGS. 2 and 3, since the off-time of the regulated modulation signal $SIG_{RM}$ in each cycle is about 1 ns, which is shorter than two cycles of the reference clock signal $SIG_{RFCK}$, the second counter 136 would not generate the turn-on reset signal $SIG_{ONRST}$ to reset the first counter 134. Therefore, the first counter 134 will count from the first cycle to the eighth cycle of the regulated modulation signal $SIG_{RM}$, and then generate the set signal $SIG_{SET}$ to trigger the SR latch 138 to pull up the demodulated output signal $SIG_{DOUT}$.

In some embodiments, the set signal $SIG_{SET}$ generated by the first counter 134 can be controlled by referencing the most significant bit of the counter register in the first counter 134. Similarly, the reset signal $SIG_{RST}$ and the turn-on reset signal $SIG_{ONRST}$ generated by the second counter 136 can also be controlled by referencing the some bits of the counter register in the second counter 136.

Figure 5:
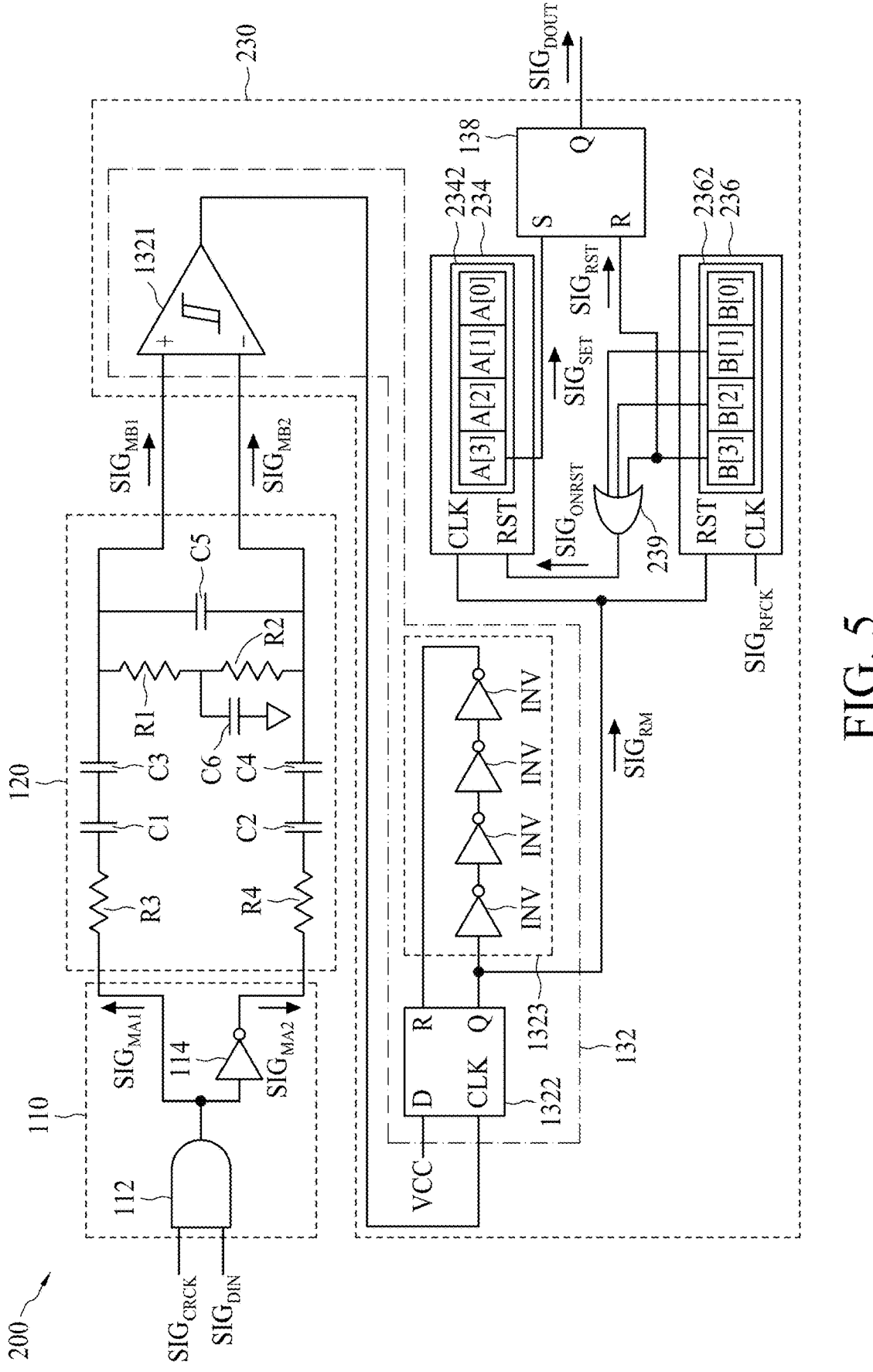
FIG. 5 shows a digital isolator according to a second embodiment of the present disclosure.

FIG. 5 shows a digital isolator 200 according to a second embodiment of the present disclosure. The digital isolator 200 is different from the digital isolator 100 in that the output terminals of the first counter 234 and the second counter 236 in the demodulation circuit 230 can be coupled to selected bits of the counter registers therein.

As shown in FIG. 5, the first counter 234 includes a counter register 2342 having a size of 4 bits for recording the current counted value. The current counted value can be represented by bit A[3] to bit A[0], and the output terminal of the first counter 234 is coupled to the most significant bit A[3] of the counter register 2342 for outputting the set signal $SIG_{SET}$ as the counted value is updated to eight. However, the present disclosure is not limited thereto. In some other embodiments, the size of the counter register 2342 may be determined according to the turn-on deglitch threshold number to be used for the first counter 234.

In addition, as shown in FIG. 5, the second counter 236 includes a counter register 2362 having a size of 4 bits for recording the current counted value. The current counted value can be represented by bit B[3] to bit B[0], and the first output terminal of the second counter 236 is coupled to the most significant bit B[3] of the counter register 2362 for outputting the reset signal $SIG_{RST}$ as the counted value is updated to eight.

Furthermore, in the second embodiment, the demodulation circuit 230 includes an OR gate 239. The OR gate 239 in combination with the second counter 236 can generate the turn-on reset signal $SIG_{ONRST}$ for resetting the first counter 234. The OR gate 239 has a plurality of input terminals (e.g., three input terminals) coupled to a plurality of most significant bits of the counter register 2362 (e.g., bits B[3] to B[1]). In such case, whenever the regulated modulation signal $SIG_{RM}$ remains at the logic low voltage for more than two cycles of the reference clock signal $SIG_{RFCK}$, the OR gate 239 will output the turn-on reset signal $SIG_{ONRST}$ having the logic high voltage to reset the first counter 234. However, the present disclosure is not limited thereto. In some other embodiments, the size of the counter register 2362 may be adjusted according to the turn-off deglitch threshold number to be used for the second counter 236, and the bits of the counter register 2362 that are coupled to the OR gate 239 may be selected according to the maximum allowable off-time to be measured by the second counter 236.

Figure 6:
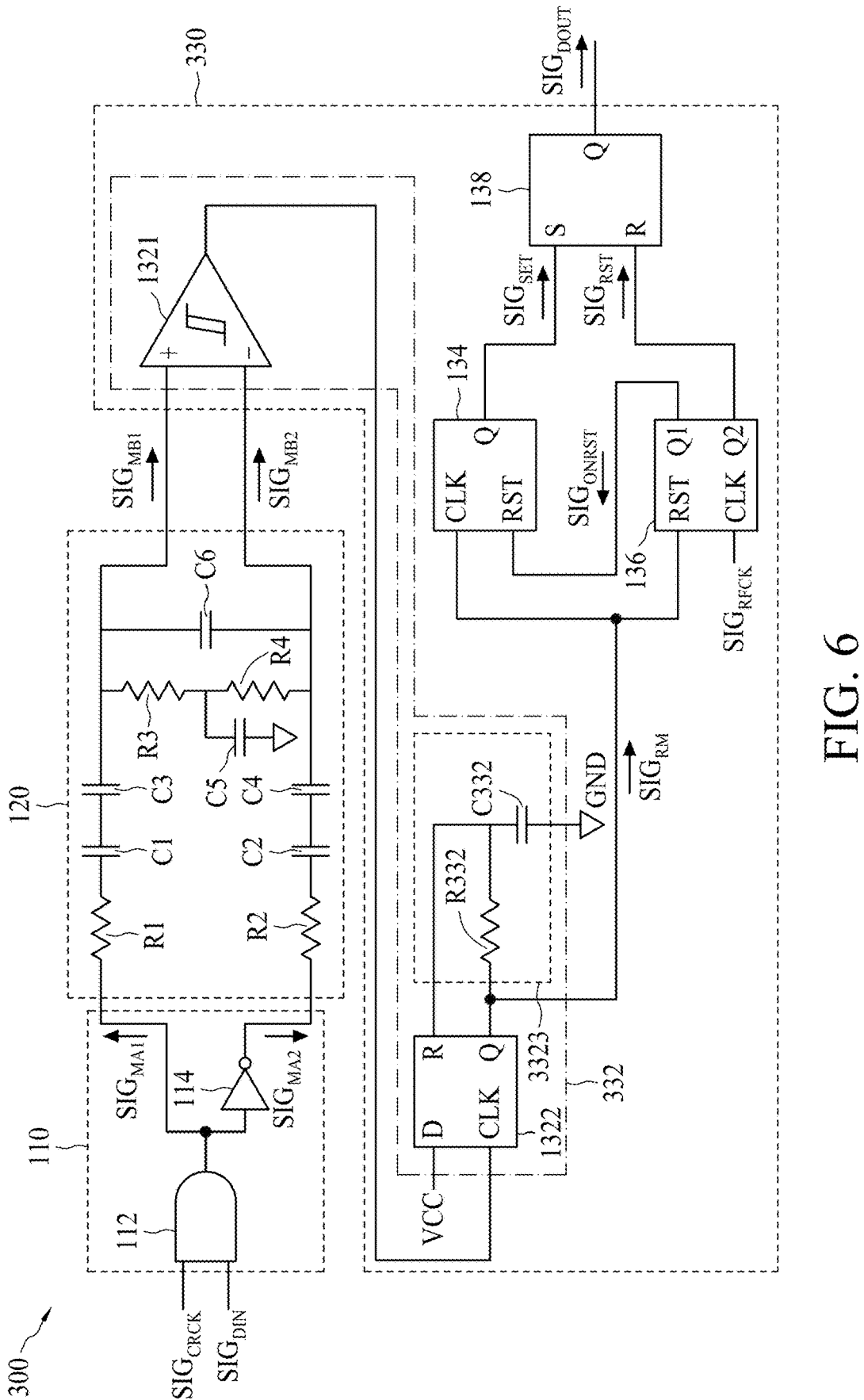
FIG. 6 shows a digital isolator according to a third embodiment of the present disclosure.

FIG. 6 shows a digital isolator 300 according to a third embodiment of the present disclosure. The digital isolator 300 is different from the digital isolator 300 in that the delay circuit 3323 in the waveform regulator 332 of the demodulation circuit 330 adopts a resistor R332 and a capacitor C332 instead of the inverters INV adopted in the delay circuit 1323. As shown in FIG. 6, the resistor R332 includes a first terminal coupled to the input terminal of the delay circuit 3323, and a second terminal coupled to the output terminal of the delay circuit 3323. The capacitor C332 includes a first terminal coupled to the second terminal of the resistor R332, and a second terminal coupled to a ground node GND.

In the present embodiment, the delay time provided by the delay circuit 3323 can be set by adjusting the resistance of the resistor R332 and/or the capacitance of the capacitor C332.

Figure 7:
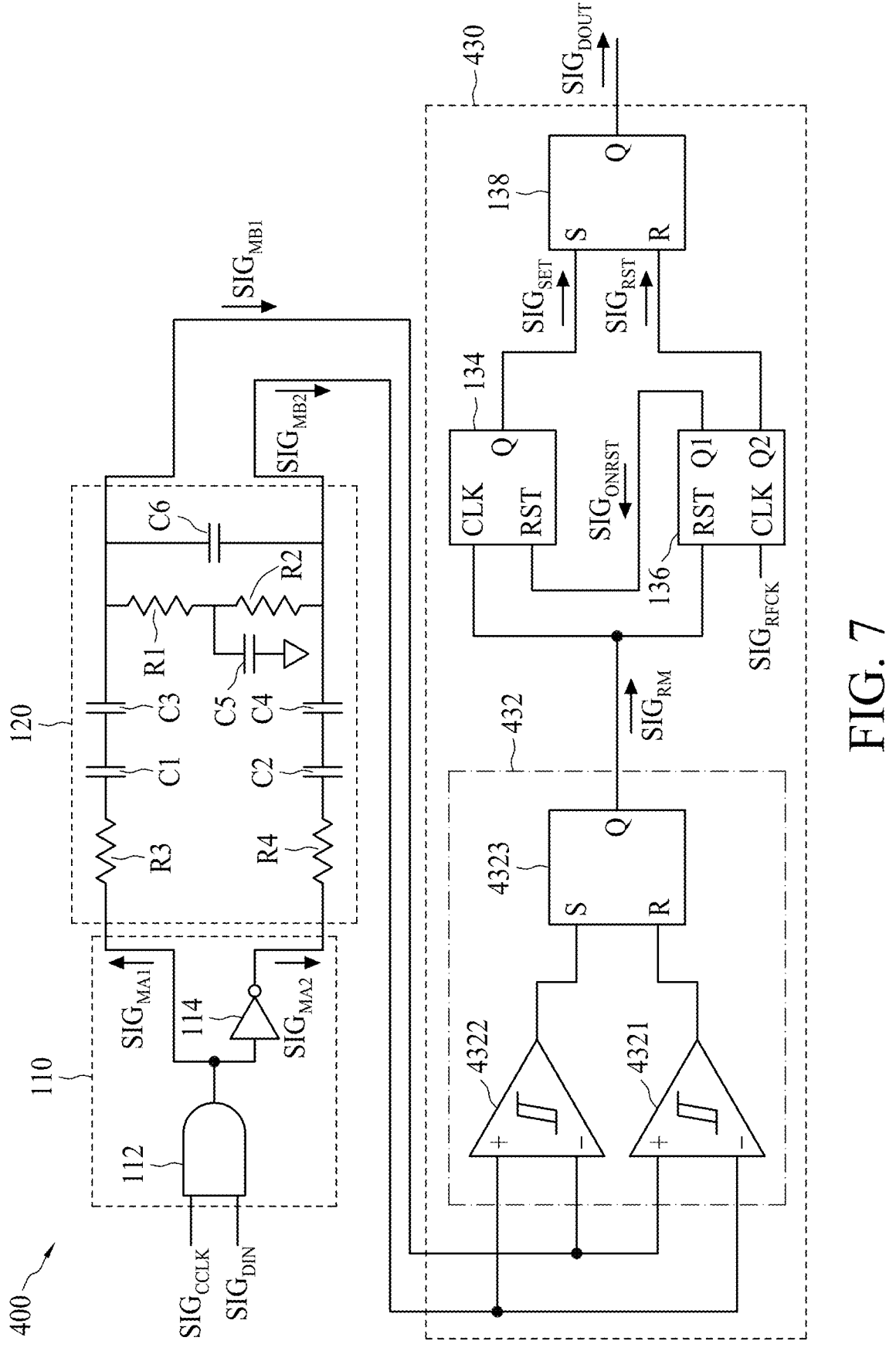
FIG. 7 shows a digital isolator according to a fourth embodiment of the present disclosure.

FIG. 7 shows a digital isolator 400 according to a fourth embodiment of the present disclosure. In the fourth embodiment, the digital isolator 400 adopts a waveform regulator 432 including two hysteric comparators 4321 and 4322 and one SR latch 4323 to replace the waveform regulator 132 in the digital isolator 100.

As shown in FIG. 7, the hysteric comparator 4321 includes a non-inverting input terminal for receiving the isolated modulation signal $SIG_{MB1}$, an inverting input terminal for receiving the isolated modulation signal $SIG_{MB2}$, and an output terminal. The hysteric comparator 4322 includes a non-inverting input terminal for receiving the isolated modulation signal $SIG_{MB2}$, an inverting input terminal for receiving the isolated modulation signal $SIG_{MB1}$, and an output terminal. The SR latch 4323 includes a set terminal coupled to the output terminal of the hysteric comparator 4322, a reset terminal coupled to the output terminal of the hysteric comparator 4321, and an output terminal for outputting the regulated modulation signal $SIG_{RM}$.

Figure 8:
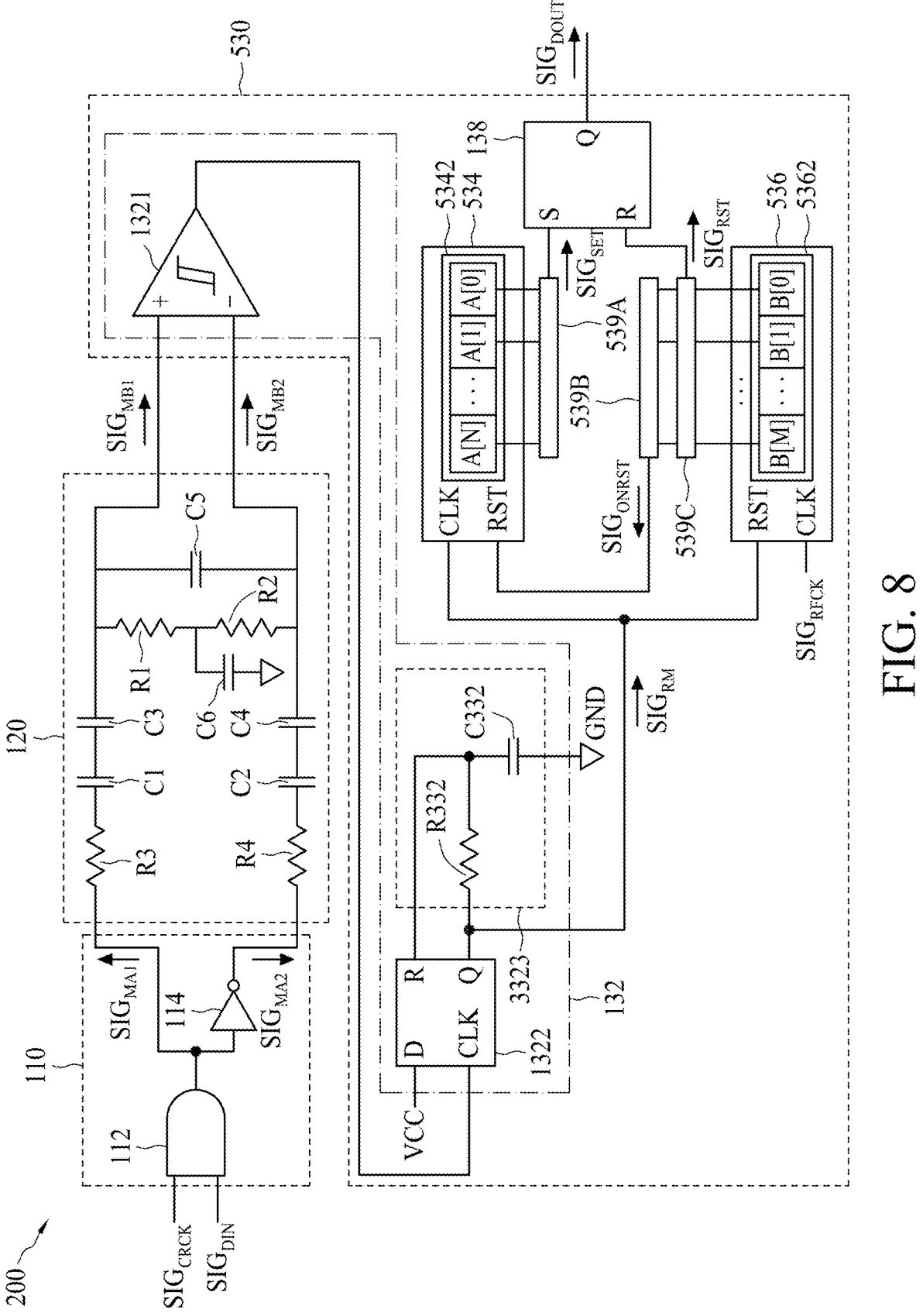
FIG. 8 shows a digital isolator according to a fifth embodiment of the present disclosure.

FIG. 8 shows a digital isolator 500 according to a fifth embodiment of the present disclosure. The digital isolator 500 is different from the digital isolator 200 in the demodulation circuit 530. In the demodulation circuit 530, the first counter 534 includes a counter register 5342 having a size of N bits for recording the current counted value, and the demodulation circuit 530 further includes a logic circuit 539A coupled to bits A[N] to bit A[0] of the counter register 5342 and the set terminal of the SR latch 138 for outputting the set signal $SIG_{SET}$ according to the current counted value of the counter register 5342 and the turn-on deglitch threshold number, where N is a positive integer. In some embodiments, the logic circuit 593A allows the user to set the turn-on deglitch threshold number (i.e., the number of cycles of the regulated modulation signal $SIG_{RM}$ that the first counter 534 needs to count before generating the set signal $SIG_{SET}$), and the logic circuit 593A can be configured accordingly to output the set signal $SIG_{SET}$ when the current counted value of the counter register 5342 reaches the predetermined turn-on deglitch threshold number. That is, the turn-on deglitch threshold number can be programmable. For example, if the user set the turn-on deglitch threshold number to be 8, then the logic circuit 539A would generate the set signal $SIG_{SET}$ having the logic high voltage when the bit A[3] becomes logic high voltage (i.e., becomes value "1").

Similarly, the second counter 536 may include a counter register 5362 having a size of M bits for recording the current counted value, and the demodulation circuit 530 further includes a logic circuit 539B coupled to bits B[M] to bit B[0] of the counter register 5362 and the reset terminal of the SR latch 138 for outputting the reset signal $SIG_{RST}$ according to the current counted value of the counter register 5362 and the turn-on deglitch threshold number, where M is a positive integer. In some embodiments, the logic circuit 593B allows the user to set the turn-off deglitch threshold number (i.e., the number of cycles of the reference clock signal $SIG_{RFCK}$ that the second counter 536 needs to count before generating the reset signal $SIG_{RST}$), and the logic circuit 593B can be configured accordingly to output the reset signal $SIG_{RST}$ when the current counted value of the counter register 5362 reaches the predetermined turn-off deglitch threshold number. That is, the turn-off deglitch threshold number can be programmable.

In addition, the demodulation circuit 530 may further includes a logic circuit 539C coupled to bits B[M] to bit B[0] of the counter register 5362 and the reset terminal of the first counter 534 for outputting the turn-on reset signal $SIG_{ONRST}$ according to the current counted value of the counter register 5362 and the maximum allowable off-time and. In some embodiments, the logic circuit 593C allows the user to set the maximum allowable off-time. For example, the logic circuit 593C may allow the user to set the number of cycles of the reference clock signal $SIG_{RFCK}$ that the second counter 536 needs to count before generating the turn-on reset signal $SIG_{ONRST}$, and the logic circuit 593C can be configured accordingly to output the turn-on reset signal $SIG_{ONRST}$ when the current counted value of the counter register 5362 reaches the predetermined number set by the user. That is, the maximum allowable off-time can be programmable. Furthermore, in the demodulation circuit 530 adopts the RC based delay circuit 3323 including the resistor R332 and the capacitor C332. However, the present disclosure is not limited thereto. In some embodiments, other types of delay circuits may be adopted. For example, in some embodiments, the delay line based delay circuit, such as the delay circuit 1323 shown in FIG. 1 and FIG. 5, can be adopted to replace the delay circuit 3323.

In summary, the digital isolator and the demodulation circuit provided by the embodiments of the present disclosure adopt two counters to control the on-time and off-time of the demodulation output signal. By taking the advantage of the time-measuring ability of the counters, the demodulation circuit is able to ignore noises caused by different types of common mode transients, thereby reducing glitches in the demodulated output signal and allowing the digital isolator to achieve high CMTI. Furthermore, since the turn-on deglitch threshold number, the turn-off deglitch threshold number, and the maximum allowable off-time are programmable with the counters, it also provides great flexibility for the circuit designers.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A demodulation circuit comprising:
a waveform regulator configured to generate a regulated modulation signal according to a pair of differential isolated modulation signals, wherein the pair of differential isolated modulation signals is generated according to a modulation of an input data signal with a carrier clock signal;
a first counter comprising a clock input terminal configured to receive the regulated modulation signal, a reset terminal, and an output terminal configured to output a set signal;
a second counter comprising a clock input terminal configured to receive a reference clock signal, a reset terminal configured to receive the regulated modulation signal, and a first output terminal configured to output a reset signal; and
a first set-reset (SR) latch comprising a set terminal coupled to the output terminal of the first counter, a reset terminal coupled to the first output terminal of the second counter, and an output terminal configured to output a demodulated output signal;
wherein the first counter is configured to count cycles of the regulated modulation signal so as to generate the set signal and trigger the first SR latch to pull up the demodulated output signal, and the second counter is configured to count cycles of the reference clock signal so as to generate the reset signal and trigger the first SR latch to pull down the demodulated output signal.

2. The demodulation circuit of claim 1, wherein the second counter further comprises a second output terminal coupled to the reset terminal of the first counter, and the second counter is further configured to output a turn-on reset signal through the second output terminal when a duration of the regulated modulation signal remaining at a logic low voltage is longer than a duration of a first predetermined number of cycles of the reference clock signal.

3. The demodulation circuit of claim 2, wherein the first counter is configured to generate the set signal when a second predetermined number of cycles of the regulated modulation signal has been counted without receiving the turn-on reset signal.

4. The demodulation circuit of claim 3, wherein the second counter is configured to generate the reset signal when a third predetermined number of cycles of the reference clock signal has been counted with the regulated modulation signal remaining at the logic low voltage.

5. The demodulation circuit of claim 4, wherein the first predetermined number, the second predetermined number and the third predetermined number are programmable.

6. The demodulation circuit of claim 1, wherein the first counter further comprises a counter register, and the output terminal of the first counter is coupled to a most significant bit of the counter register for outputting the set signal.

7. The demodulation circuit of claim 1, wherein the second counter further comprises a counter register, and the first output terminal of the second counter is coupled to a most significant bit of the counter register for outputting the reset signal.

8. The demodulation circuit of claim 7, wherein the demodulation circuit further comprises an OR gate comprising a plurality of input terminals coupled to a plurality of most significant bits of the counter register, and an output terminal coupled to the reset terminal of the first counter and configured to output a turn-on reset signal.

9. The demodulation circuit of claim 1, wherein a frequency of the reference clock signal is equal to a frequency of a carrier clock signal.

10. The demodulation circuit of claim 1, wherein the waveform regulator regulates a duty cycle of the regulated modulation signal to be substantially equal to 50% when the pair of differential isolated modulation signals toggles periodically.

11. The demodulation circuit of claim 1, wherein the waveform regulator comprises:

a hysteric comparator comprising a non-inverting input terminal configured to receive a first isolated modulation signal of the pair of differential isolated modulation signals, an inverting input terminal configured to receive a second isolated modulation signal of the pair of differential isolated modulation signals, and an output terminal;

a D flip-flop comprising a data terminal configured to receive a supply voltage, a clock terminal coupled to the output terminal of the hysteric comparator, a reset terminal, and an output terminal configured to output the regulated modulation signal; and a delay circuit comprising an input terminal coupled to the output terminal of the D flip-flop, and an output terminal coupled to the reset terminal of the D flip-flop.

12. The demodulation circuit of claim 11, wherein the delay circuit comprises a plurality of cascaded inverters.

13. The demodulation circuit of claim 11, wherein the delay circuit comprises:

a resistor comprising a first terminal coupled to the input terminal of the delay circuit, and a second terminal coupled to the output terminal of the delay circuit; and a capacitor comprising a first terminal coupled to the second terminal of the resistor, and a second terminal coupled to a ground node.

14. The demodulation circuit of claim 1, wherein the waveform regulator comprises:

a first hysteric comparator comprising a non-inverting input terminal configured to receive a first isolated modulation signal of the pair of differential isolated modulation signals, an inverting input terminal configured to receive a second isolated modulation signal of the pair of differential isolated modulation signals, and an output terminal;

a second hysteric comparator comprising a non-inverting input terminal configured to receive the second isolated modulation signal, an inverting input terminal configured to receive the first isolated modulation signal, and an output terminal; and a second SR latch comprising a set terminal coupled to the output terminal of the second hysteric comparator, a reset terminal coupled to the output terminal of the first hysteric comparator, and an output terminal configured to output the regulated modulation signal.

15. A digital isolator comprising:

a demodulation circuit of claim 1; and an isolation circuit configured to receive an pair of differential modulated input signals generated by modulating the input data signal with the carrier clock signal and output the pair of differential isolated modulation signals.

16. The digital isolator of claim 15, wherein the second counter further comprises a second output terminal coupled to the reset terminal of the first counter, and the second counter is further configured to output a turn-on reset signal through the second output terminal when a duration of the regulated modulation signal remaining at a logic low voltage is longer than a duration of a first predetermined number of cycles of the reference clock signal.

17. The digital isolator of claim 15, wherein the isolation circuit comprises:

a first capacitor comprising a first terminal configured to receive a first modulated input signal of the pair of differential modulated input signals, and a second terminal;

a second capacitor comprising a first terminal configured to receive a second modulated input signal of the pair of differential modulated input signals, and a second terminal;

a third capacitor comprising a first terminal coupled to the second terminal of the first capacitor, and a second terminal configured to output a first isolated modulation signal of the pair of differential isolated modulation signals;

a fourth capacitor comprising a first terminal coupled to the second terminal of the second capacitor, and a second terminal configured to output a second isolated modulation signal of the pair of differential isolated modulation signals;

a first resistor comprising a first terminal coupled to the second terminal of the third capacitor, and a second terminal; and a second resistor comprising a first terminal coupled to the second terminal of the fourth capacitor, and a second terminal coupled to the second terminal of the first resistor.

18. The digital isolator of claim 17, wherein the isolation circuit further comprises:

a third resistor comprising a first terminal configured to receive the first modulated input signal, and a second terminal coupled to the first terminal of the first capacitor; and a fourth resistor comprising a first terminal configured to receive the second modulated input signal, and a second terminal coupled to the first terminal of the second capacitor.

19. The digital isolator of claim 15, further comprising a modulation circuit configured to generate the pair of differential modulated input signals by modulating the input data signal with the carrier clock signal.

20. The digital isolator of claim 19, wherein the modulation circuit comprises:

an AND gate comprising a first input terminal configured to receive the carrier clock signal, a second input terminal configured to receive the input data signal, and an output terminal configured to output a first modulated input signal of the pair of differential modulated input signals; and an inverter comprising an input terminal coupled to the output terminal of the AND gate, and an output terminal configured to output a second modulated input signal of the pair of differential modulated input signals.

* * * * *